(12) United States Patent
Tokida et al.

(10) Patent No.: US 8,864,351 B2
(45) Date of Patent: Oct. 21, 2014

(54) VEHICLE HEADLAMP

(75) Inventors: Tsukasa Tokida, Shizuoka (JP); Noriko Sato, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 21 days.

(21) Appl. No.: 13/031,786

(22) Filed: Feb. 22, 2011

(65) Prior Publication Data

US 2011/0222303 A1    Sep. 15, 2011

(30) Foreign Application Priority Data

Mar. 12, 2010    (JP) ................. 2010-055900

(51) Int. Cl.
| | |
|---|---|
| F21V 7/00 | (2006.01) |
| F21S 8/10 | (2006.01) |
| H01L 33/60 | (2010.01) |
| H01L 33/58 | (2010.01) |

(52) U.S. Cl.
CPC ............ *F21S 48/1154* (2013.01); *H01L 33/60* (2013.01); *F21S 48/1159* (2013.01); *F21S 48/1163* (2013.01); *H01L 33/58* (2013.01)
USPC ....................... 362/516; 362/296.01; 362/298

(58) Field of Classification Search
USPC .................. 362/538, 507, 539, 516, 517, 518
See application file for complete search history.

(56) References Cited

U.S. PATENT DOCUMENTS

| | | | | |
|---|---|---|---|---|
| 7,019,334 B2 * | 3/2006 | Yatsuda et al. | ................... | 257/98 |
| 7,210,831 B2 * | 5/2007 | Ishida | ........................... | 362/539 |
| 7,246,930 B2 * | 7/2007 | Yatsuda et al. | ................. | 362/539 |
| 7,312,477 B2 * | 12/2007 | Yatsuda et al. | ................... | 257/98 |
| 7,316,488 B2 * | 1/2008 | Wall, Jr. | ......................... | 362/351 |
| 7,530,709 B2 * | 5/2009 | Kikuchi et al. | ................ | 362/231 |
| 7,695,176 B2 * | 4/2010 | Ohtaki et al. | ................. | 362/539 |
| 7,794,112 B2 * | 9/2010 | Higashi et al. | ................ | 362/248 |
| 8,044,412 B2 * | 10/2011 | Murphy et al. | ................. | 257/81 |
| 8,093,613 B2 * | 1/2012 | Yatsuda et al. | ................... | 257/98 |
| 8,100,555 B2 * | 1/2012 | Higashii et al. | ............... | 362/248 |
| 8,142,060 B2 * | 3/2012 | Saida et al. | .................... | 362/539 |
| 2005/0057917 A1 * | 3/2005 | Yatsuda et al. | ................. | 362/84 |
| 2005/0068786 A1 | 3/2005 | Ishida | | |

(Continued)

FOREIGN PATENT DOCUMENTS

| | | |
|---|---|---|
| JP | 2004-063499 A | 2/2004 |
| JP | 2005108555 A | 4/2005 |
| JP | 2008-282575 A | 11/2008 |
| JP | 2009-087681 A | 4/2009 |

OTHER PUBLICATIONS

Office Action dated Nov. 5, 2013, issued by the Japanese Patent Office in counterpart Japanese Application No. 2010-055900.

*Primary Examiner* — Jong-Suk (James) Lee
*Assistant Examiner* — Bryon T Gyllstrom
(74) *Attorney, Agent, or Firm* — Sughrue Mion, PLLC

(57) ABSTRACT

A vehicle headlamp is provided with a light emitting module. The light emitting module is provided with a light emitting portion and a frame member. The frame member surrounds the light emitting portion to define a light emitting surface. The frame member includes a first surface and a second surface in which a part of an internal diffusing/reflection light reflected on the first surface is to be projected upwardly of a cutoff line of a low-beam light distribution pattern, and a part of the internal diffusing/reflection light reflected on the second surface is to be projected downwardly of the cutoff line. A reflectance of the first surface is lower than a reflectance of the second surface.

20 Claims, 6 Drawing Sheets

Q-Q

(56) References Cited

U.S. PATENT DOCUMENTS

| | | | |
|---|---|---|---|
| 2006/0209557 A1* | 9/2006 | Komatsu | 362/539 |
| 2007/0159839 A1* | 7/2007 | Komatsu | 362/538 |
| 2007/0247865 A1* | 10/2007 | Kinoshita et al. | 362/538 |
| 2008/0123337 A1* | 5/2008 | Higashi et al. | 362/267 |
| 2009/0010017 A1* | 1/2009 | Hayashi et al. | 362/516 |
| 2010/0002457 A1* | 1/2010 | Takada | 362/509 |

\* cited by examiner

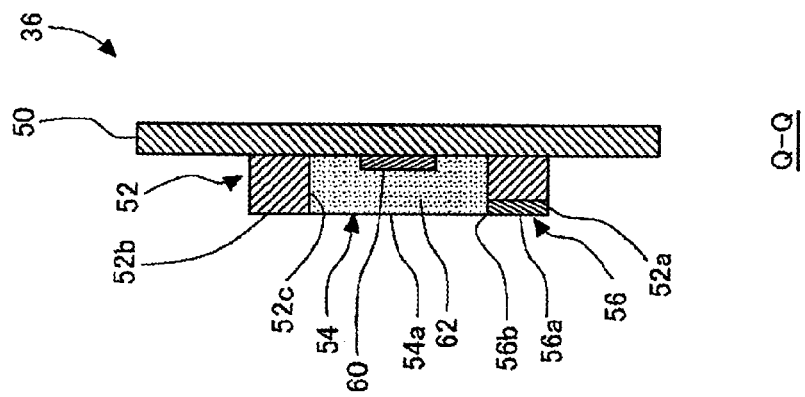
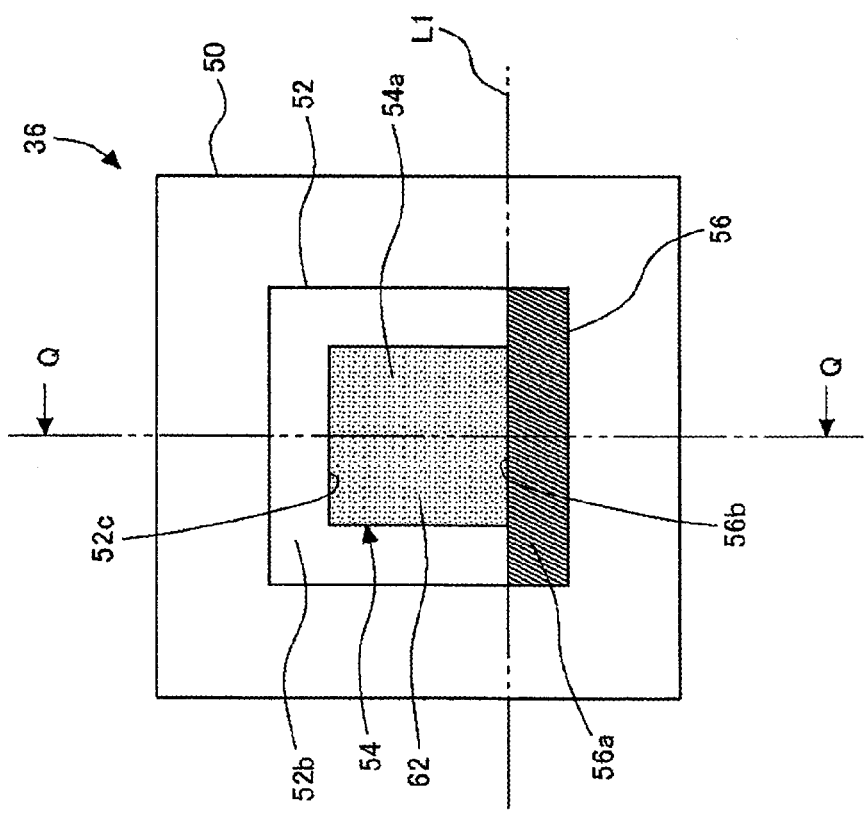

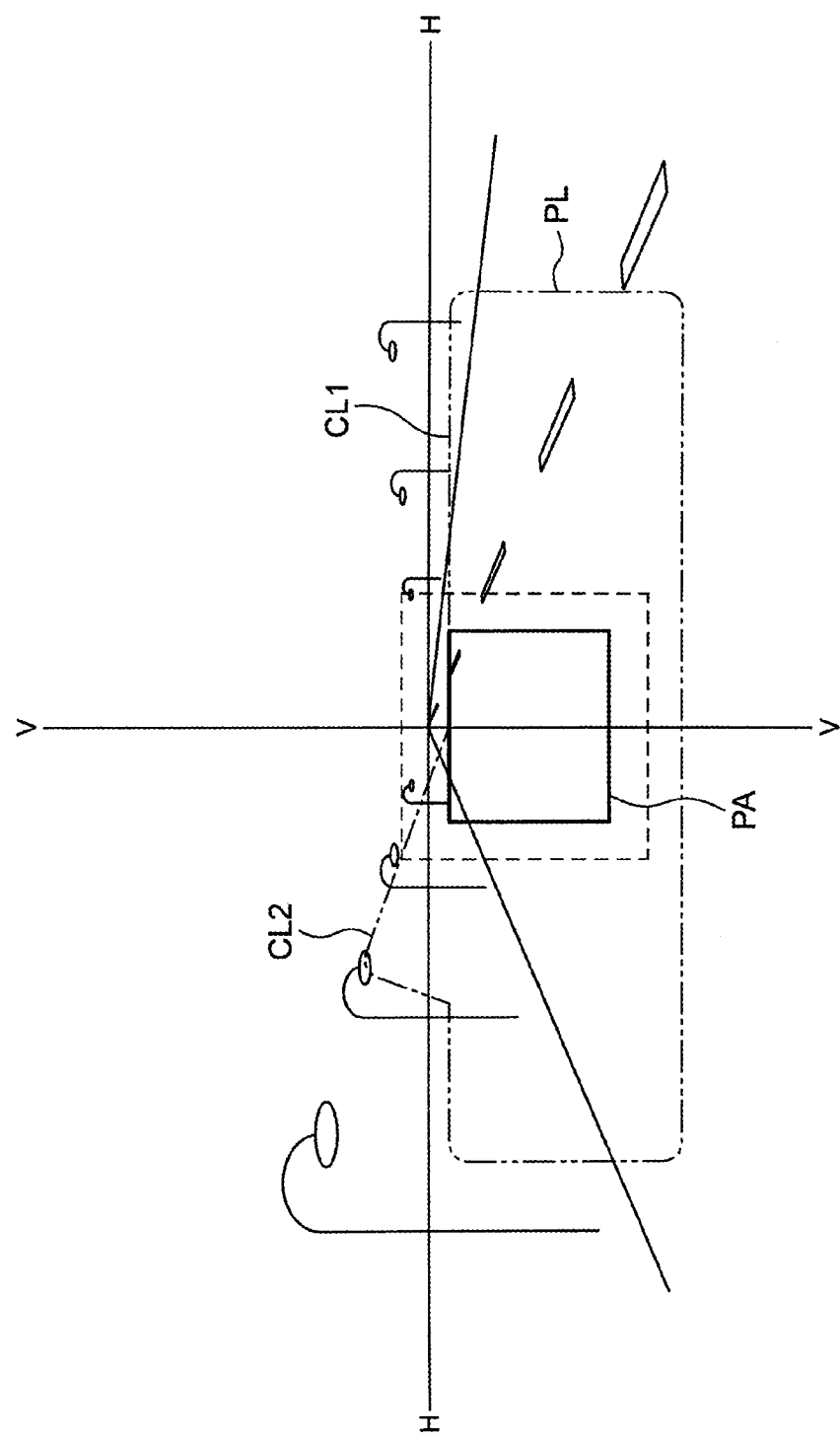

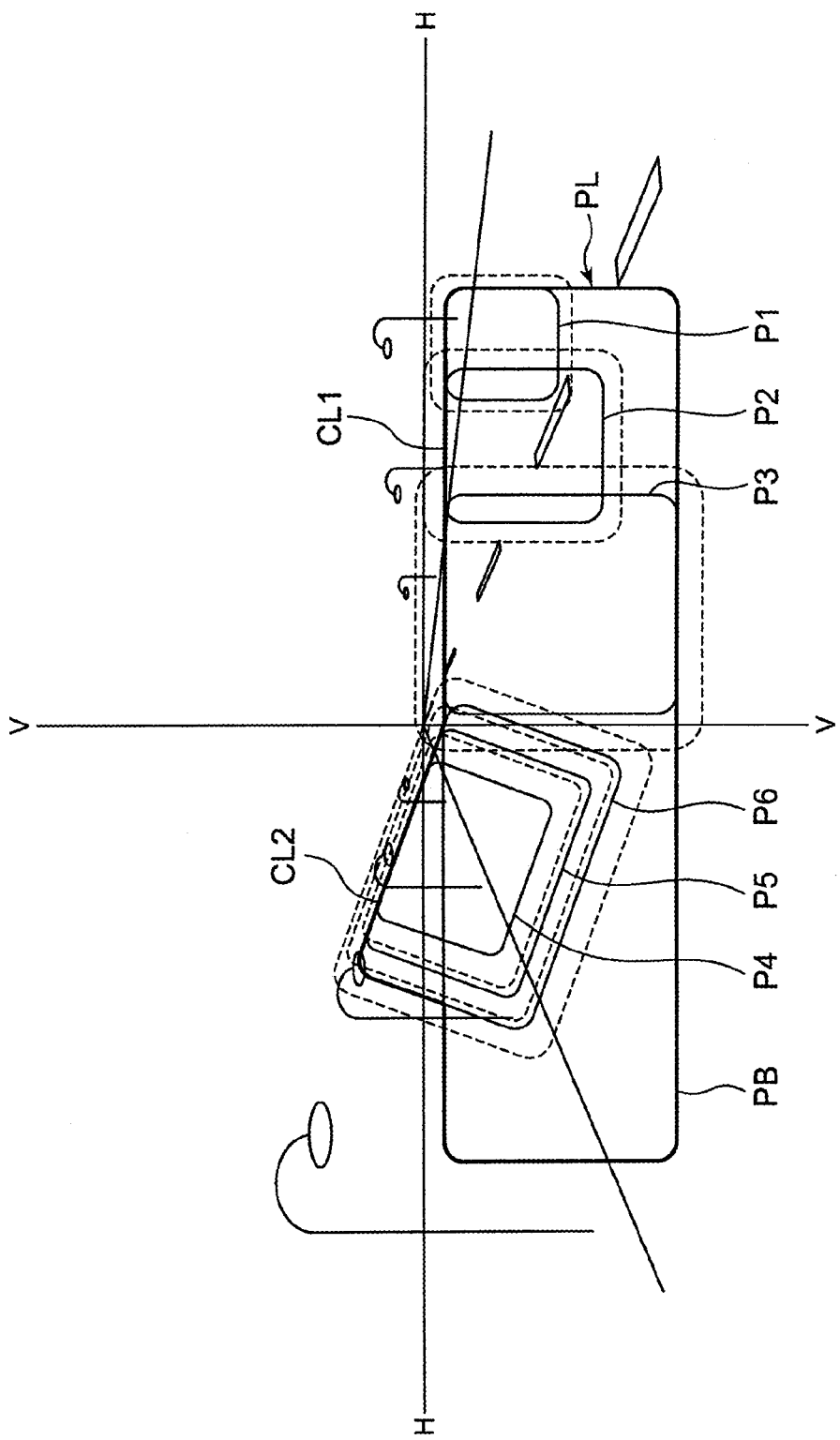

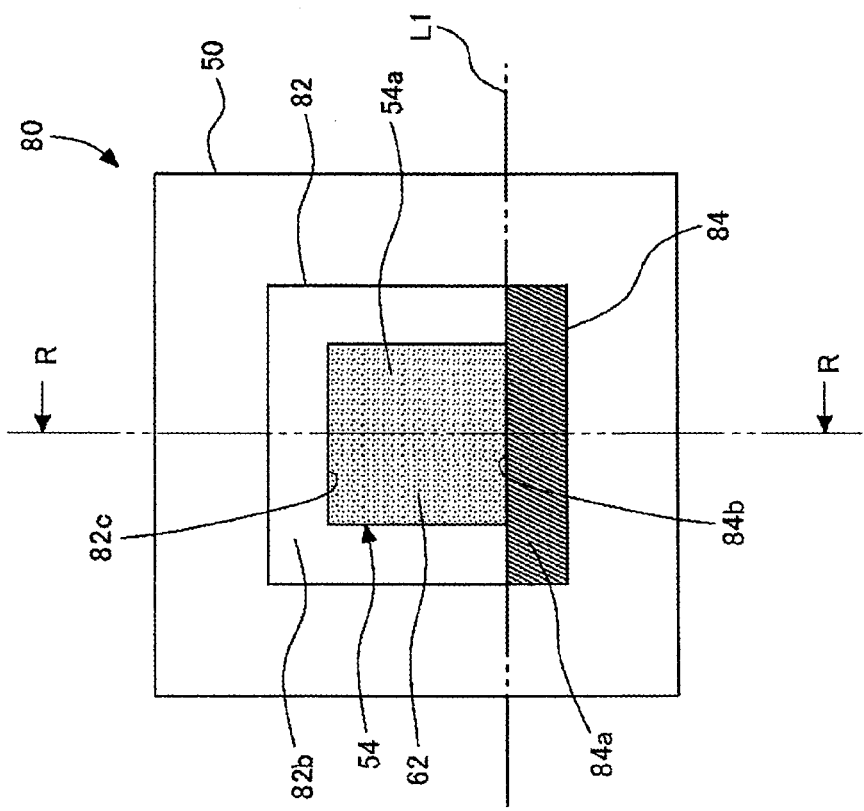

VEHICLE HEADLAMP

BACKGROUND OF THE INVENTION

1. Field of the Invention

The present invention relates to a vehicle headlamp and a light emitting module of a vehicle headlamp.

2. Related Art

In recent years, in order to meet demands for energy saving and higher reliability, there has been increased a use of a semiconductor light emitting element such as an LED (Light Emitting Diode). Further, in JP-A-2005-108555, a vehicle headlamp using the LED to form a low-beam light distribution pattern is proposed. In this type of vehicle headlamp, since an image projected on a light emitting surface by the light emitting element is used as a portion of the low-beam light distribution pattern, it is possible to provide a low-beam light source with a simple structure.

Most parts of lights emitted from the light emitting surface are directly projected on a projection lens and are radiated forwardly of a lamp. However, within a lamp chamber of the vehicle headlamp, there is also present a slight amount of internal diffusing/reflection light which is produced due to the light emitted from the light emitting surface and is reflected by various parts in the lamp chamber to thereby radiate an inside of the lamp chamber. Thus, in the vehicle headlamp (such as JP-A-2005-108555) where a portion of the low-beam light distribution pattern is formed by using a shape of the light emitting surface without using a shade, if there exist any composing parts of the headlamp in a periphery of the light emitting surface, there is a possibility that the internal diffusing/reflection light is reflected on such composing parts to be projected upwardly of the cutoff line of the low-beam light distribution pattern. When the lights are projected upwardly of the cutoff line, there is a fear that glare can be given to a driver of a vehicle running ahead and pedestrians walking ahead.

SUMMARY OF THE INVENTION

One or more embodiments of the invention provide a vehicle head lamp in which an amount of light that is radiated upwardly of a cutoff line of a low-beam light distribution pattern is reduced.

In accordance with one or more embodiments of the invention, a vehicle headlamp may include a light emitting module. The light emitting module may include a light emitting portion and a frame member that surrounds the light emitting portion to define a light emitting surface. The light emitting module may be adapted to form at least a portion of a low-beam light distribution pattern through an optical member configured to project an image corresponding to a shape of the light emitting surface. The frame member includes a first surface and a second surface. The first surface is located in a position such that a part of an internal diffusing/reflection light reflected on the first surface is to be projected upwardly of a cutoff line of the low-beam light distribution pattern. The second surface is located in a position such that a part of the internal diffusing/reflection light reflected on the second surface is to be projected downwardly of the cutoff line. A reflectance of the first surface may be lower than a reflectance of the second surface.

Other aspects and advantages of the invention will be apparent from the following description and the appended claims.

BRIEF DESCRIPTION OF THE DRAWINGS

FIG. 3A is a front view of a light emitting module according to the first exemplary embodiment.

FIG. 3B is a section view taken along a line Q-Q in FIG. 3A.

FIG. 4 is a view of a hot zone light distribution pattern PA formed on a virtual vertical screen by a first optical unit.

FIG. 5 is a view of a wide zone distribution light distribution pattern PB formed on a virtual vertical screen by a second optical unit.

FIG. 6A is a front view of a light emitting module according to a second exemplary embodiment.

FIG. 6B is a section view thereof taken along a line R-R in FIG. 6A.

DETAILED DESCRIPTION OF THE EXEMPLARY EMBODIMENTS

Exemplary embodiments and modified examples thereof are described with reference to the accompanying drawings.

First Exemplary Embodiment

Figure 1:
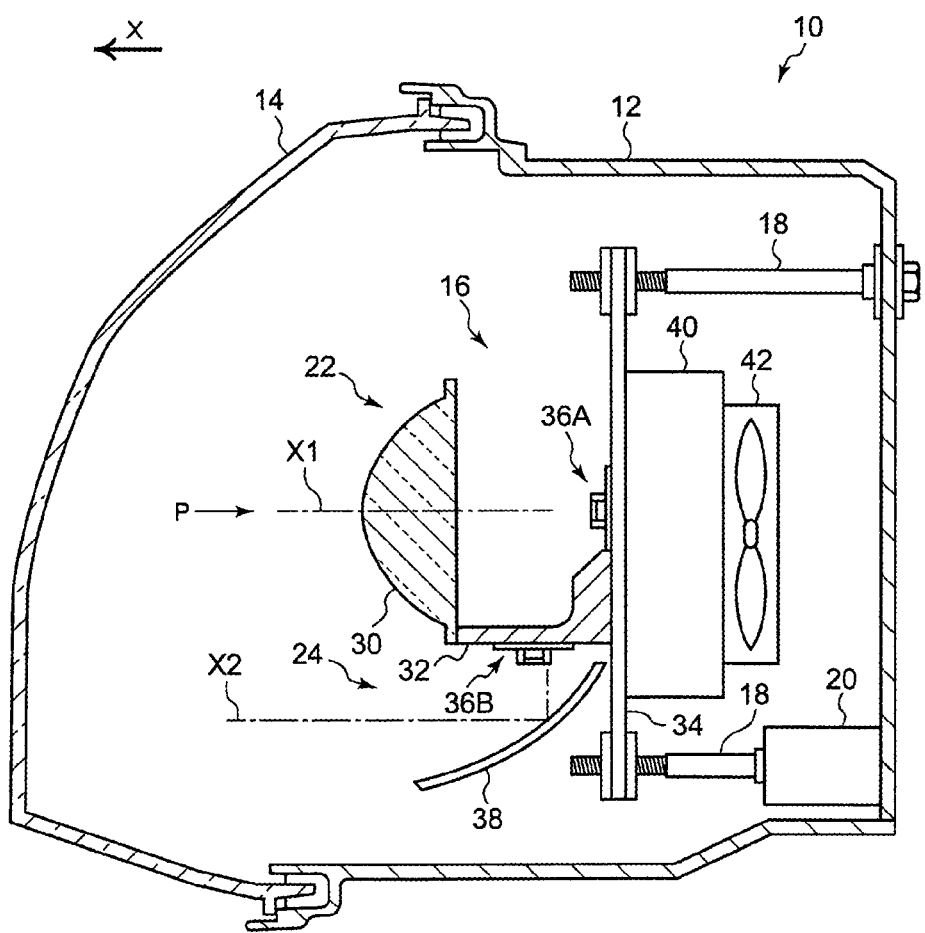
FIG. 1 is a section view of a structure of a vehicle headlamp according to a first exemplary embodiment.
Figure 2:
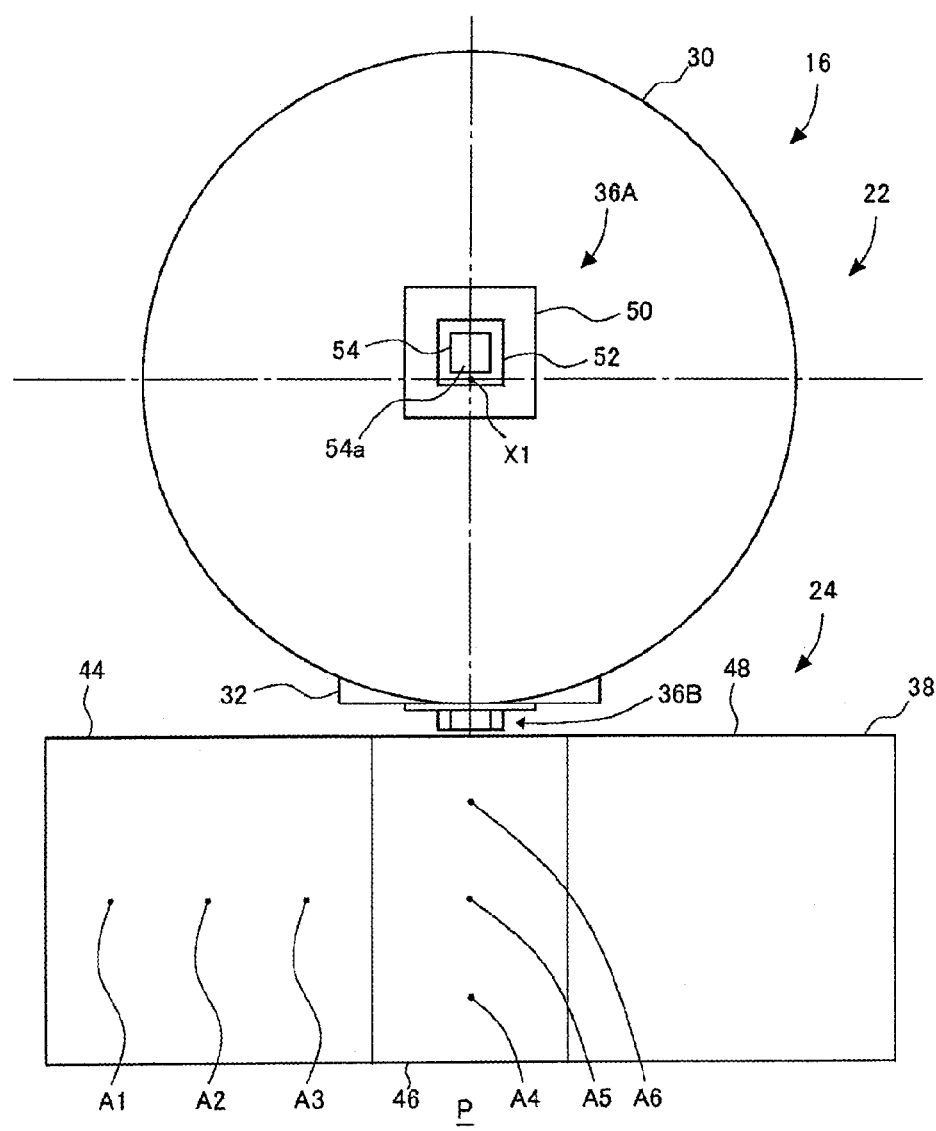
FIG. 2 is a front view of the vehicle headlamp according to the first exemplary embodiment.

FIG. 1 is a section view of a structure of a vehicle headlamp 10 according to a first exemplary embodiment. FIG. 2 is a front view of the vehicle headlamp 10 according to the first exemplary embodiment. Now, description will be given below of the structure of the vehicle headlamp 10 with reference to FIGS. 1 and 2.

The vehicle headlamp 10 includes a housing 12, an outer cover 19 and a lamp unit 16. Here, description will be given below assuming that a direction, where an arrow mark X indicated in FIG. 1 is a forward direction of the lamp. It is also assumed that, when the lamp is seen in the forward direction from a rear side, the right side is referred to as a lamp right side and the left side as a lamp left side. FIG. 1 shows the section of the vehicle headlamp 10 cut by a vertical plane including a first optical axis X1 (which will be discussed later) of the lamp unit 16, when it is viewed from the lamp left side. Here, when the vehicle headlamp 10 is mounted onto a vehicle, in the vehicle, specifically, in the left forward and right forward portions of the vehicle, there are provided two vehicle headlamps 10 which are formed symmetric. In FIG. 1, there is shown the structure of one of the right and left vehicle headlamps 10.

The housing 12 is formed in a box shape which has an opening. The outer cover 14 is made of translucent resin or glass into a bowl shape. The edge portion of the outer cover 14 is mounted onto the opening of the housing 12. Thus, in an area which is covered by the housing 12 and outer cover 14, there is formed a lamp chamber.

Within the lamp chamber, there are provided two lamp units 16. The two lamp units 16 are disposed within the lamp chamber in such a manner that both of them are allowed to radiate their respective lights forwardly of the lamps. Each of the lamp units 16 includes a first optical unit 22 and a second optical unit 24. The first optical unit 22 includes a projection lens 30, a support member 32, a support plate 34, and a first light emitting module 36A. The second optical unit 24 includes a second light emitting module 36B and a reflector unit 38. The first and second light emitting modules 36A and 36B are similar in structure to each other and, in the following description, as the need arises, they are collectively called "light emitting module 36. The lamp unit 16 is used as a low-beam light source which forms a low-beam light distributing pattern using the first and second optical units 22 and 24.

The corner portions of the support plate 34 are respectively fixed to the housing 12 using their respective aiming screws 18. The first light emitting module 36A and support member 32 are respectively fixed to the front surface of the support plate 34. A radiator fin 40 is mounted on the back surface of the support plate 34 and is mainly used to radiate the heat that is generated by the first and second light emitting modules 36A and 36B. A cooling fan 42 is mounted on the radiator fin 40 and is used to blow the air to the radiator fin 40 to thereby facilitate the heat radiation of the radiator fin 40.

The support member 32 is used to support a projection lens 30. The projection lens 30 is made of a plano-convex aspherical lens the lamp forward side surface of which is a convex surface and the rearward side surface of which is a plane; and, the projection lens 30 projects a light source image, which is formed on its rear focal plane, as an inverted image forwardly of the lamp. The projection lens 30 functions as an optical member which condenses lights emitted from the first light emitting module 36A toward the forward direction of the lamp.

The second light emitting module 36B is mounted on the lower surface of the support member 32 in such a manner that its optical axis is directed vertically downward. The reflector unit 38 is disposed downwardly of the second light emitting module 36B and is fixed to the support plate 34. The reflector unit 38 functions as an optical member which reflects and condenses lights emitted from the second light emitting module 36B forwardly, that is, substantially parallel to a second optical axis X2.

The lower aiming screw 18 is structured such that it can be rotated due to the operation of a leveling actuator 20. Thus, when the leveling actuator 20 is operated, the optical axis of the lamp unit 16 can be moved in the vertical direction.

FIG. 2 is a view of the lamp unit 16 when it is viewed from a view point P shown in FIG. 1. The first light emitting module 36A includes a base plate 50, a frame member 52 and a light emitting portion 54. The base plate 50 is formed in a rectangular shape and is disposed perpendicularly to the first optical axis X1 of the projection lens 30. The frame member 52 and light emitting portion 54 are respectively fixed to the surface of the base plate 50 that is opposed to the projection lens 30.

The frame member 52 is formed in a rectangular frame shape and has a square shaped opening opened up in the central portion thereof. The light emitting portion 54 is disposed within the opening and the exposed surface thereof provides a light emitting surface 54a. The frame member 52 surrounds the light emitting portion 54 in such a manner that it can define the light emitting surface 54a. The light emitting portion 54 is structured in such a manner that lights emitted from the light emitting surface 54a can be used to form a portion of a low-beam light emitting pattern through the projection lens 30. Here, the light emitting portion 54 may also be structured in such a manner that lights emitted from the light emitting surface 54a can be used to form a portion of a low-beam light emitting pattern through the projection lens 30. The first light emitting module 36A is disposed in such a manner that the light emitting surface 54a is symmetric with respect to a vertical surface including the first optical axis X1. The first light emitting module 36A is also disposed such that the light emitting surface 54a exists on the rear focal plane of the projection lens 30.

The second light emitting module 36B is fixed to the lower surface of the support member 32 in such a manner that the center of its light emitting surface is situated vertically downward of the first optical axis X1. The reflector unit 38 includes a first reflector 44, a second reflector 44 and a third reflector 48. The first and third reflectors 44 and 48 are formed such that they are symmetric about a vertical plane including the first optical axis X1. The first and third reflectors 44 and 48 respectively include a reflecting surface having a substantially parabolic cylinder shape, while they reflect lights from a group of focuses in such a manner that, in the vertical direction, the lights advance substantially parallel to each other, whereas, in the horizontal direction, the lights are diffused.

The second reflector 46 is interposed between the first and third reflectors 44 and 48. The second reflector 46 includes a reflecting surface formed of a free curved surface the basic shape of which can be obtained by rotating a parabola. The second reflector 46 expands the shape of the square-shaped light emitting surface 54a slightly into an oblong shape and also rotates it slightly. The reflector unit 38 is disposed in such a manner that, from left when viewed from the view point P, the first reflector 44, second reflector 46 and third reflector 48 are arranged in the horizontal direction in this order.

The second light emitting module 36B is mounted on the support member 32 in such a manner that a low reflection layer 56 is situated backwardly of the light emitting surface 54a. Also, the second light emitting module 36B is disposed in such a manner that the elliptic focuses of the first and third reflectors 44 and 48 are respectively situated substantially in the center of the low reflecting layer 56. Owing to this structure, using the respective reflected lights of the first and third reflectors 44 and 48, the projection images of the light emitting surface 54a can be arranged in the horizontal direction and can be superimposed on top of each other, thereby being able to form an oblong light distribution pattern.

In this manner, the projection lens 30 functions as an optical member which, using the lights emitted from the light emitting surface 54a of the first light emitting module 36A, can project images following the shape of the light emitting surface 54a. Also, the reflector unit 38 functions as an optical member which, using the lights emitted from the light emitting surface 54a of the first light emitting module 36B, can project images following the shape of the light emitting surface 54a. The first and second light emitting modules 36A and 36B respectively form a portion of a low-beam light distribution pattern respectively through the projection lens 30 and reflector unit 38.

Here, there may also be provided only one of the first and second optical units 22 and 24. In this case, the first light emitting module 36A may also form the whole of the low-beam light distributing pattern through the projection lens 30, or the second light emitting module 36B may also form the whole of the low-beam light distributing pattern through the reflector unit 38.

FIG. 3A is a front view of the light emitting module 36 according to the first exemplary embodiment, and FIG. 3B is a section view thereof taken along the Q-Q line shown in FIG. 3A. The light emitting portion 54 includes a semiconductor light emitting element 60 and a fluorescent member 62. The semiconductor light emitting element 60 is mounted on the base plate 50. The frame member 52 is mounted on the base plate 50 in such a manner that the semiconductor light emitting element 60 is situated in the center of a rectangular-shaped opening 52c formed in the central portion of the frame member 52. The fluorescent member 62 is filled into the opening 52c of the frame member 52 mounted on the base plate 50, while the fluorescent member 62 is formed in such a manner that the exposed surface thereof is flush with the surface of the frame member 52. Such surface of the fluorescent member 62 as is exposed after it is filled into the opening 52c provides the light emitting surface 54a.

In the first exemplary embodiment, as the semiconductor light emitting element 60, there is employed a blue LED (Light Emitting Diode) which emits mainly a blue light. Also, as the fluorescent member 62, there is employed a member which is capable of changing a blue light into a yellow light. When the semiconductor light emitting element 60 emits a light, in the light emitting portion 54, a blue light emitted from the semiconductor light emitting element 60 and a yellow light the wavelength of which has been changed by the fluorescent member 62 are added and mixed together, whereby there is emitted a white light from the light emitting surface 54a.

However, of course, the light emitting portion 54 is not limited to the portion that emits a white color, but there may also be employed a portion which emits other color light such as a delicate yellow light or a delicate blue light. Also, as the semiconductor light emitting element 60, there may also be employed an element which emits mainly other light of a different wavelength than the blue color light such as an ultraviolet light.

The light emitting module 36 is disposed in such a manner that the light emitting surface 54a is situated on the rear focal plane of the projection lens 30. Also, in FIG. 3A, a line L1 shows a line existing on the surface of the frame member 52 which, on a virtual vertical screen, is projected as a straight line including a cutoff line. The light emitting module 36 is disposed in such a manner that the lower edge portion of the opening 52c is superimposed on the line L1. In the following description, of the surfaces of the frame member 52, the surface existing downward of the line L1 is referred to as a first surface 52a, while the surface existing upward of the line L1 is referred to as a second surface 52b.

When an internal diffusing/reflection light (that is generated when the light emitting element 60 is turned ON and the light is reflected by various parts in the lamp chamber) is radiated onto the second surface 52b and reflected on the second surface 52b, the second surface 52b forms a projected image downwardly of a cutoff line which will be discussed later. On the other hand, the first surface 52a forms a projected image upwardly of the cutoff line if the internal diffusing/reflection light radiated on the first surface 52a is reflected on the first surface 52a. If the internal diffusing/reflection light is projected upwardly of the cutoff line in this manner, there is a possibility that the glare can be given to the driver of a vehicle running ahead or the like.

According to the first exemplary embodiment, to eliminate such possibility, on the first surface 52a, there is mounted a low reflection layer 56 in such a manner that it covers the front surface of the first surface 52a. The low reflection layer 56 may be formed of a high heat resisting member which has a heat resistance of 200° C. or higher. As the low reflection layer 56, there may be employed a thin-plate-shaped metal member including a non-reflection layer formed on the surface thereof. The non-reflection layer is a layer the surface of which has a lower light reflectance than the surface of ordinary resin; and, such layer may be formed, for example, by applying a low reflectance member onto the low reflection layer 56. The low reflection layer 56 may be fixed to the first surface 52a by mechanical fastening means such as caulking or by adhesion. In this case, a surface of the low reflection layer 56 is referred to as a first surface 56a.

The first surface 56a of the low reflection layer 56 is structured such that its reflectance is lower than that of the second surface 52b of the frame member 52. Thanks to this, it is possible to reduce the amount of the light that is projected upwardly of the cutoff line due to the second surface 52b of the frame member 52, thereby being able to reduce the amount of the glare that is given to the driver of the vehicle running ahead or the like. Here, the low reflection layer 56 may not be mounted on the first surface 52a but, instead, a low reflection layer may be formed directly on the first surface 52a.

Further, the upper edge portion 56b of the low reflection layer 56 constitutes a portion of the inner edge of the opening 52c of the frame member 52. Therefore, the upper edge portion 56b defines a portion of the light emitting surface 54a. Also, the lower reflection layer 56 is disposed in such a manner that the upper edge portion 56b is superimposed on the line L1. Therefore, the upper edge portion 56b defines the cutoff line. Here, the upper edge portion 56b may also be disposed such that it does not define the whole of the cutoff line but defines a portion thereof.

By disposing the upper edge portion 56b such that it can define the cutoff line in this manner, an area existing upwardly of the cutoff line with the cutoff line as the boundary can be darkened suddenly. This makes it possible to show the cutoff line clearly.

FIG. 4 is a view of a hot zone light distribution pattern PA which is formed on the virtual vertical screen by the first optical unit 22. The hot zone light distribution pattern PA is formed in the hot zone, where the illuminance of the light must be enhanced, of a low-beam light distribution pattern PL which should be formed by the first and second optical units 22 and 24. The low-beam light distribution pattern PL includes first and second cutoff lines CL1 and CL2. The first cutoff line CL1 extends, in an area existing on the right with respect to a vertical line (V-V line) extending in the vertical direction from a center point, in the horizontal direction slightly downwardly of a horizontal line (H-H line) extending from the center point. The second cutoff line CL2 extends, in area existing on the left with respect to the V-V line, in such a manner that it is inclined as it goes to the left from a point of intersection between the first cutoff line CL1 and V-V line.

The hot zone light distribution pattern PA is formed in such a manner that, in the first light emitting module 36A, a projection image formed on such portion of the light emitting surface 54a as is in contact with the upper edge portion 56b of the low reflection layer 56 can be superimposed on the first cutoff line CL1. This can reduce the amount of the lights that leak out upwardly of the first and second cutoff lines CL1 and CL2. Therefore, especially, there can be realized a low-beam light distribution pattern PL in which the first cutoff line CL1 can be formed clearly and positively.

FIG. 5 is a view of a wide zone light distribution pattern PB which is formed on a virtual vertical screen by the second optical unit 24. A low-beam light distribution pattern PL to be formed can be formed in such a manner that this wide zone light distribution pattern PB and the above-mentioned hot zone light distribution pattern PA are superimposed on top of each other.

The first reflector 44 reflects the lights emitted from the second light emitting module 36B to thereby form a substantially rectangular light distribution pattern in such portion of the wide zone light distribution pattern PB as exists on the right with respect to the substantially central portion of the pattern PB. In this case, the second light emitting module 36B and first reflector 44 cooperate together in forming the first cutoff line CL1. The second reflector 46 forms such light distribution pattern of the wide zone light distribution pattern PB as can be produced by slightly rotating a rectangle, in order that the second cutoff line CL2 can be formed. The third reflector 48 reflects the lights emitted from the second light emitting module 36B to thereby form a substantially rectangular light distribution pattern in such portion of the wide zone light distribution pattern PB as exists on the left substantially from the center of the pattern PB.

In FIG. 5, there are shown projection images P1-P3. They are respectively are formed on points A1-A3 shown in FIG. 2 by their respective reflected lights. The projection image P1, which is formed by the reflected light on the point A1 existing in the vicinity of the left end portion of the first reflector 44, is formed in a rectangular shape in the vicinity of the right end portion of the wide zone light distribution pattern PB with its upper edge portion in contact with the first cutoff line CL1. The projection image P2, which is formed by the reflected light on the point A2 existing substantially in the center of the first reflector 44, is formed in a rectangular shape substantially in the central portion of the right half section of the wide zone light distribution pattern PB, with its upper edge portion in contact with the first cutoff line CL1. The projection image P3, which is formed by the reflected light on the point A3 existing on the right of the first reflector 44, that is, existing nearer to the second reflector 46 than the points A1 and A2, is formed in a rectangular shape in the near-to-center portion of the wide zone light distribution pattern PB with its upper edge portion in contact with the first cutoff line CL1.

Here, the projection image P3 is formed larger than the projection image P2, while the projection image P2 is formed larger than the projection image P1. Therefore, the wide zone light distribution pattern PB is formed in such a manner that as it goes to the center thereof, the larger projection images are superimposed on top of each other. Also, a light distribution pattern, which is formed by the reflected light of the third reflector 48, is formed to have symmetry with the above-mentioned light distribution pattern formed by the reflected light of the first reflector 44 about a vertical surface including the optical axis of the second light emitting module 36B.

In the first light emitting module 36A, the low reflection layer 56 is disposed downwardly of the light emitting surface 54a. Therefore, when the hot zone light distribution pattern PA is formed, upwardly of the first and second cutoff lines CL1 and CL2, there is radiated the reflected light of the first surface 56a of the low reflection layer 56. This can reduce the amount of the light that is radiated upwardly of the first and second cutoff lines CL1 and CL2 due to the internal diffusing/reflection light of the frame member surrounding the light emitting surface 54a.

In FIG. 5, there are further shown projection images P4-P6. They are respectively formed on points A4-A6 shown in FIG. 2 by their respective reflected lights. The projection image P4, which is formed due to the reflected light on the point 4A existing in the vicinity of the lower end portion of the second reflector 46 in FIG. 4, is formed to have a shape which can be obtained by extending the projection image of the light emitting surface 54a longer sideways and also by slightly rotating it in such a manner that its upper edge portion is in contact with the second cutoff line CL2. The projection image P5, which is formed due to the reflected light on the point A5 existing substantially centrally of the second reflector 46, is formed to have a shape which can be obtained when extending the projection image of the light emitting surface 54a longer sideways and larger than the projection image P4, and also when slightly rotating it in such a manner that its upper edge portion is in contact with the second cutoff line CL2. The projection image P6, which is formed by the reflected light of the point A6 existing near to the upper end portion of the second reflector 46, is formed to have a shape which can be obtained when extending the projection image of the light emitting surface 54a longer sideways and larger than the projection image P5, and also when rotating it in such a manner that its upper edge portion is in contact with the second cutoff line CL2.

In the second light emitting module 36B, the low reflection layer 56 is disposed backwardly of the light emitting surface 54a. Therefore, when the wide zone light distribution pattern PB is formed, upwardly of the first and second cutoff lines CL1 and CL2, there is radiated the reflected light of the first surface 56a of the low reflection layer 56. This can reduce the amount of the light that is radiated upwardly of the first and second cutoff lines CL1 and CL2 due to the internal diffusing/reflection light radiated and reflected on the frame member surrounding the light emitting surface 54a.

Second Exemplary Embodiment

FIG. 6A is a front view of a light emitting module 80 according to the second exemplary embodiment, and FIG. 6B is a section view thereof taken along the R-R line shown in FIG. 6A. In the following description, the same parts of the second exemplary embodiment as those of the first exemplary embodiment are given the same designations and thus the description thereof is omitted here.

The light emitting module 80 is similar in structure to the light emitting module 36 according to the first exemplary embodiment except that, instead of the frame member 52, there is provided a frame member 82. In the second exemplary embodiment as well, the light emitting module 80 is disposed in such a manner that, of an opening 82c, the lower edge portion thereof is superimposed on the line L1. In the following description, of the surfaces of the frame member 82, the surface thereof existing downwardly of the line L1 is referred to as a first surface 82a, while the surface thereof existing upwardly of the line L1 is referred to as a second surface 82b.

The frame member 82 is structured similarly to the frame member 52 according to the first exemplary embodiment except that the first surface 82a becomes more distant from the projection lens 30 as it goes from the inner edge of the opening 82c toward the outer edge of the frame member 82. A low reflection layer 84 is mounted on the thus inclined first surface 82a. The material of the low reflection layer 84, a non-reflection layer applied on the surface of the low reflection layer 84 and the like may be similar to the low reflection layer 56 according to the first exemplary embodiment. The surface of the low reflection layer 84 is hereinafter referred to as a first surface 84a.

In this manner, according to the second exemplary embodiment, the first surface 84a of the low reflection layer 84 is inclined in such a manner that it becomes more distant from the projection lens 30 or reflector unit 38 as it goes from the upper edge portion 84b defining the first cutoff line CL1 or second cutoff line CL2 toward the outer edge of the frame member 82. In this manner, since the first surface 84a of the low reflection layer 84 is structured such that it has a lower reflectance than the second surface 82b of the frame member 82, and also since it is inclined, when compared with a case where the first surface 84a is parallel to the second surface 82b, it is possible to reduce the amount of the light that is radiated just upwardly of the first cutoff line CL1 or second cutoff line CL2 due to the internal diffusing/reflection light radiated and reflected on the first surface 84a. This can reduce the amount of the glare that is given to the driver of a vehicle running ahead or the like.

While description has been made in connection with specific exemplary embodiments and modified examples thereof, it will be obvious to those skilled in the art that various changes and modifications may be made therein without departing from the present invention. It is aimed, therefore, to cover in the appended claims all such changes and modifications falling within the true spirit and scope of the present invention.

In accordance with the exemplary embodiments and the modified examples thereof, a vehicle headlamp may include a light emitting module. The light emitting module may include a light emitting portion and a frame member that surrounds the light emitting portion to define a light emitting surface. The light emitting module may be adapted to form at least a portion of a low-beam light distribution pattern through an optical member configured to project an image corresponding to a shape of the light emitting surface. The frame member includes a first surface and a second surface. The first surface is located in a position such that a part of an internal diffusing/reflection light reflected on the first surface is to be projected upwardly of a cutoff line of the low-beam light distribution pattern. The second surface is located in a position such that a part of the internal diffusing/reflection light reflected on the second surface is to be projected downwardly of the cutoff line. A reflectance of the first surface may be lower than a reflectance of the second surface.

According to this structure, it is possible to reduce the amount of the light that is radiated upwardly of the cutoff line due to the internal diffusing/reflection light from the frame member. This can reduce the amount of the glare that is given to persons existing ahead of a vehicle when the low-beam light distribution pattern is formed. Here, the optical member may be a projection lens for projecting an image projected on the rear focal plane of the projection lens, or a reflector for reflecting the light that is emitted from the light emitting portion.

Further, the internal diffusing/reflection light may be a light produced due to the light emitted from the light emitting surface and is reflected by various parts in the lamp chamber to thereby radiate an inside of the lamp chamber.

The frame member may include an inner edge defining the light emitting surface. A part of the inner edge may be configured to define at least a portion of the cutoff line. The part of the inner edge defining the cutoff line may be included in the first surface.

According to this structure, it is possible to reduce an amount of reflection light of the internal diffusing/reflection light with the part of the inner edge defining the cutoff line as a boundary. This makes it possible to project the cutoff line more clearly.

The first surface may be inclined so that it becomes more distant from said optical member as it goes from said part of the inner edge toward an outer edge of the frame member.

According to this structure, the light incident on the projection lens reflected on the first surface can be reduced. This makes it possible to reduce more properly the amount of the glare that is given to persons existing ahead of the vehicle when the low-beam light distribution pattern is formed.

According to the embodiments and examples, it is possible to reduce the amount of light that is radiated upwardly of the cutoff line.

DESCRIPTION OF REFERENCE NUMERALS AND SIGNS

10: Vehicle headlight
16: Lamp unit
22: First optical unit
24: Second optical unit
30: Projection lens
36: Light emitting module
36a: First light emitting module
36b: Second light emitting module
44: First reflector
46: Second reflector
48: Third reflector
52: Frame member
52a: First surface
52b: Second surface
52c: Opening
54: Light emitting portion
54a: Light emitting surface
56: Low reflection layer
56a: First surface
56b: Upper edge portion
80: Light emitting module
82: Frame member

What is claimed is:

1. A vehicle headlamp comprising:
a light emitting module including:
a light emitting portion including a light emitting surface that emits light; and
a frame member that surrounds the light emitting portion to define the light emitting surface,
wherein the light emitting module is adapted to form at least a portion of a low-beam light distribution pattern through an optical member configured to project an image corresponding to a shape of the light emitting surface,
wherein the frame member comprises:
a first member comprising a first surface, the first surface located on a position where a part of an internal diffusing/reflection light reflected on the first surface is to be projected upwardly of a cutoff line of the low-beam light distribution pattern; and
a second member comprising a second surface, the second surface located on a position where a part of the internal diffusing/reflection light reflected on the second surface is to be projected downwardly of the cutoff line,
wherein a reflectance of the first surface is lower than a reflectance of the second surface,
wherein each of the first and second members comprises an inner-most surface being flush with the light emitting portion, and
wherein the first and second surfaces are disposed at an outer side of an outer-edge of the light emitting surface and are coplanar with the light emitting surface.

2. The vehicle headlight according to claim 1, wherein the frame member includes an inner edge defining the light emitting surface,
wherein a part of the inner edge is configured to define at least a portion of the cutoff line, and
wherein said part of the inner edge is included in said first surface.

3. The vehicle headlight according to claim 2, wherein the first surface is inclined so that it becomes more distant from said optical member as it goes from said part of the inner edge toward an outer edge of the frame member.

4. The vehicle headlight according to claim 1, wherein the light emitting portion comprises a semiconductor light emitting element.

5. The vehicle headlight according to claim 4, wherein the semiconductor light emitting element is a light emitting diode.

6. The vehicle headlight according to claim 1, wherein the light emitting portion comprises a semiconductor light emitting element and a fluorescent member.

7. The vehicle headlight according to claim 6, wherein the semiconductor light emitting element is disposed in the center of an opening of a central portion of the frame member and the fluorescent member is filled into the opening of the frame member.

8. The vehicle headlight according to claim 7, wherein an exposed surface of the fluorescent member is flush with an exposed surface of the frame member.

9. The vehicle headlight according to claim 1, wherein the first surface comprises a low reflection layer disposed on an exposed surface of the first surface.

10. The vehicle headlight according to claim 1, wherein the frame member contacts edges of the light emitting surface.

11. A light emitting module comprising:
a light emitting portion including a light emitting surface that emits light; and
a frame member for surrounding the light emitting portion to define the light emitting surface,
wherein the light emitting module is adapted to form at least a portion of a low-beam light distribution pattern through an optical member configured to project an image corresponding to a shape of the light emitting surface,
wherein the frame member comprises:
a first member comprising a first surface, the first surface located on a position where a part of an internal diffusing/reflection light reflected on the first surface is to be projected upwardly of a cutoff line of the low-beam light distribution pattern; and
a second member comprising a second surface, the second surface located on a position where a part of the internal diffusing/reflection light reflected on the second surface is to be projected downwardly of the cutoff line,
wherein a reflectance of the first surface is lower than a reflectance of the second surface,
wherein each of the first and second members comprises an inner-most surface being flush with the light emitting portion in a light emitting direction, and
wherein the first and second surfaces are disposed at an outer side of an outer-most edge of the light emitting surface and are coplanar with the light emitting surface.

12. The light emitting module according to claim 11, wherein the light emitting portion comprises a semiconductor light emitting element.

13. The light emitting module according to claim 12, wherein the semiconductor light emitting element is a light emitting diode.

14. The light emitting module according to claim 11, wherein the light emitting portion comprises a semiconductor light emitting element and a fluorescent member.

15. The light emitting module according to claim 14, wherein the semiconductor light emitting element is disposed in the center of an opening of a central portion of the frame member and the fluorescent member is filled into the opening of the frame member.

16. The light emitting module according to claim 15, wherein an exposed surface of the fluorescent member is flush with an exposed surface of the frame member.

17. The light emitting module according to claim 11, wherein the first surface comprises a low reflection layer disposed on an exposed surface of the first surface.

18. The light emitting module according to claim 11, wherein the frame member contacts edges of the light emitting surface.

19. A vehicle headlamp comprising:
a light emitting module including:
a light emitting portion including a light emitting surface that emits light; and
a frame member that surrounds the light emitting portion to define the light emitting surface,
wherein the light emitting module is adapted to form at least a portion of a low-beam light distribution pattern through an optical member configured to project an image corresponding to a shape of the light emitting surface,
wherein the frame member comprises:
a first member comprising a first surface, the first surface located on a position where a part of an internal diffusing/reflection light reflected on the first surface is to be projected upwardly of a cutoff line of the low-beam light distribution pattern; and
a second member comprising a second surface, the second surface located on a position where a part of the internal diffusing/reflection light reflected on the second surface is to be projected downwardly of the cutoff line,
wherein a reflectance of the first surface is lower than a reflectance of the second surface, wherein each of the first and second members comprises an inner-most surface being flush with the light emitting portion, and
wherein the first surface does not overlap with a fluorescent member of the light emitting portion.

20. A light emitting module comprising:
a light emitting portion including a light emitting surface that emits light; and
a frame member for surrounding the light emitting portion to define the light emitting surface,
wherein the light emitting module is adapted to form at least a portion of a low-beam light distribution pattern through an optical member configured to project an image corresponding to a shape of the light emitting surface,
wherein the frame member comprises:
a first member comprising a first surface, the first surface located on a position where a part of an internal diffusing/reflection light reflected on the first surface is to be projected upwardly of a cutoff line of the low-beam light distribution pattern; and
a second member comprising a second surface, the second surface located on a position where a part of the internal diffusing/reflection light reflected on the second surface is to be projected downwardly of the cutoff line,
wherein a reflectance of the first surface is lower than a reflectance of the second surface,
wherein each of the first and second members comprises an inner-most surface being flush with the light emitting portion in a light emitting direction, and
wherein the first surface does not overlap with a fluorescent member of the light emitting portion.

* * * * *